(12) United States Patent
Sato

(10) Patent No.: US 9,377,491 B2
(45) Date of Patent: Jun. 28, 2016

(54) SHUNT RESISTOR BASED CURRENT SENSOR

(71) Applicant: YAZAKI CORPORATION, Tokyo (JP)

(72) Inventor: Takashi Sato, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 71 days.

(21) Appl. No.: 14/358,088

(22) PCT Filed: Dec. 11, 2012

(86) PCT No.: PCT/JP2012/082111
§ 371 (c)(1),
(2) Date: May 14, 2014

(87) PCT Pub. No.: WO2013/089114
PCT Pub. Date: Jun. 20, 2013

(65) Prior Publication Data
US 2014/0320150 A1    Oct. 30, 2014

(30) Foreign Application Priority Data

Dec. 13, 2011 (JP) ................. 2011-271821

(51) Int. Cl.
| | | |
|---|---|---|
| *G01R 31/36* | (2006.01) | |
| *G01R 19/32* | (2006.01) | |
| *G01R 1/20* | (2006.01) | |
| *G01R 35/00* | (2006.01) | |

(52) U.S. Cl.
CPC ............. *G01R 19/32* (2013.01); *G01R 1/203* (2013.01); *G01R 31/3696* (2013.01); *G01R 35/005* (2013.01)

(58) Field of Classification Search
USPC ............. 324/601, 105, 107, 126, 120, 713, 324/76.11, 522, 525, 705; 361/679.54, 704, 361/719, 736, 783, 86; 429/90, 178, 432; 338/49, 322
See application file for complete search history.

(56) References Cited

U.S. PATENT DOCUMENTS 5,300,917 A * 4/1994 Maue ..................... G01R 1/203
338/226
6,489,693 B1 * 12/2002 Hetzler ............. G01R 19/0092
307/10.1

(Continued)

FOREIGN PATENT DOCUMENTS

| CN | 101425699 A | 5/2009 |
| JP | 2000-235050 A | 8/2000 |

(Continued)

OTHER PUBLICATIONS

Chinese Office Action dated Jul. 2, 2015 issued in corresponding Chinese Patent Application No. 201280061092.3.

(Continued)

*Primary Examiner* — Melissa Koval
*Assistant Examiner* — Nasima Monsur
(74) *Attorney, Agent, or Firm* — Morgan, Lewis & Bockius LLP

(57) ABSTRACT

A temperature sensor (60) is placed positionally corresponding to a central portion of a shunt resistor portion (SR). According to the configuration, it is possible to detect an approximately average temperature of the shunt resistor portion (SR) while avoiding a temperature biased in the temperature distribution in the shunt resistor portion (SR). As a result, the temperature of the shunt resistor portion which is the base of the resistance is reliably detected to enable the accuracy of current detection to be improved.

11 Claims, 5 Drawing Sheets

(56) References Cited

U.S. PATENT DOCUMENTS

| | | | | |
|---|---|---|---|---|
| 2008/0030208 A1* | 2/2008 | Aratani | ............... | G01R 1/203 324/713 |
| 2009/0039836 A1* | 2/2009 | Asada | ............... | G01K 1/14 320/152 |
| 2011/0089931 A1 | 4/2011 | Podlisk et al. | | |
| 2011/0241649 A1 | 10/2011 | Ozawa | | |

FOREIGN PATENT DOCUMENTS

| | | | | |
|---|---|---|---|---|
| JP | 2005-188931 A | 7/2005 | | |
| JP | 2009-040314 A | 2/2009 | | |
| WO | WO 2010121841 A1 * | 10/2010 | ............. | G01R 1/203 |

OTHER PUBLICATIONS

International Preliminary Report on Patentability dated Jun. 17, 2014 for International application No. PCT/JP2012/082111.

Extended European Search Report dated Jul. 8, 2015 for corresponding European Patent Application No. 12856941.5.

International Search Report (with translation) and PCT/ISA/237 dated Jan. 15, 2013 for International application No. PCT/JP2012/082111.

Japanese Office Action dated Jul. 24, 2015 in corresponding Japanese Patent Application No. 2011-271821 and English translation of same.

* cited by examiner

SHUNT RESISTOR BASED CURRENT SENSOR

TECHNICAL FIELD

The present invention relates to a shunt resistor based current sensor.

BACKGROUND ART

Conventionally, a shunt resistor based current sensor has been proposed in which, in order to detect a pulse current, a large AC current, or the like, a current to be measured is flown through a shunt resistor portion the resistance of which is known, and a voltage drop produced in the shunt resistor portion is detected, whereby the magnitude of the current to be measured is detected. In a shunt resistor based current sensor of this kind, the resistance of the shunt resistor portion sometimes changes depending on the temperature. Therefore, the temperature of the shunt resistor portion is detected, and the resistance is corrected in accordance with the temperature. On a circuit board on which a voltage detection IC or the like for detecting a voltage drop is mounted, consequently, also a temperature sensor is mounted.

In Patent Literature 1, a busbar which is connected to the negative terminal of a battery functions also as a shunt resistor portion that is used for detecting a current of the battery. A temperature sensor is placed in the vicinity of two poles which detect the potential difference caused by the shunt resistor portion. The placement of the temperature sensor in the vicinity of the poles enhances the coupling characteristics with the temperature of the busbar.

CITATION LIST

Patent Literature

Patent Literature JP-A-2009-40314

SUMMARY OF INVENTION

Technical Problem

In the technique disclosed in Patent Literature 1, however, the temperature sensor is placed in the vicinity of the poles, i.e., at a position which is biased toward one end portion of the shunt resistor portion. In the case where a temperature distribution exists in the busbar, therefore, there is a possibility that a temperature biased in the distribution is detected. As a result, there is a disadvantage that the temperature of the shunt resistor portion which is the base of the resistance cannot be reliably detected, and the accuracy of current detection is lowered.

The invention has been conducted in view of the problem. It is an object of the invention to reliably detect the temperature of a shunt resistor portion which is the base of the resistance, whereby the accuracy of current detection can be improved.

Solution to Problem

In order to solve the problem, the invention provides a shunt resistor based current sensor having: a busbar which is configured by including a shunt resistor portion, and which has a substantially planar plate shape; a circuit board which is disposed on the busbar; a pair of connection terminal portions which are disposed corresponding to both end portions of the shunt resistor portion, and which are electrically connected to the circuit board; a voltage detecting unit which is disposed on the circuit board, and which detects a value of a voltage that is applied to the circuit board through the pair of connection terminal portions, in order to detect a magnitude of a current to be measured flowing through the busbar; and a temperature detecting unit which is disposed on the circuit board, and which detects a temperature of a vicinity of the busbar in order to allow the voltage detecting unit to perform correction. Here, the temperature detecting unit is placed positionally corresponding to a central portion of the shunt resistor portion in the busbar.

Here, preferably, the invention further has a heat conduction member which is interposed between the busbar and the circuit board.

In the invention, moreover, the busbar further has a connecting portion which is connected to the circuit board by deforming a part of the busbar toward the circuit board.

In the invention, furthermore, the circuit board includes a pattern which is located between the connecting portion and the temperature detecting unit.

Advantageous Effects of Invention

According to the invention, the temperature detecting unit is placed positionally corresponding to a central portion of the shunt resistor portion, and therefore it is possible to detect an approximately average temperature of the shunt resistor portion while avoiding a temperature biased in the temperature distribution in the shunt resistor portion. As a result, the temperature of the shunt resistor portion which is the base of the resistance is reliably detected to enable the accuracy of current detection to be improved.

DESCRIPTION OF EMBODIMENTS

First Embodiment

Figure 1:
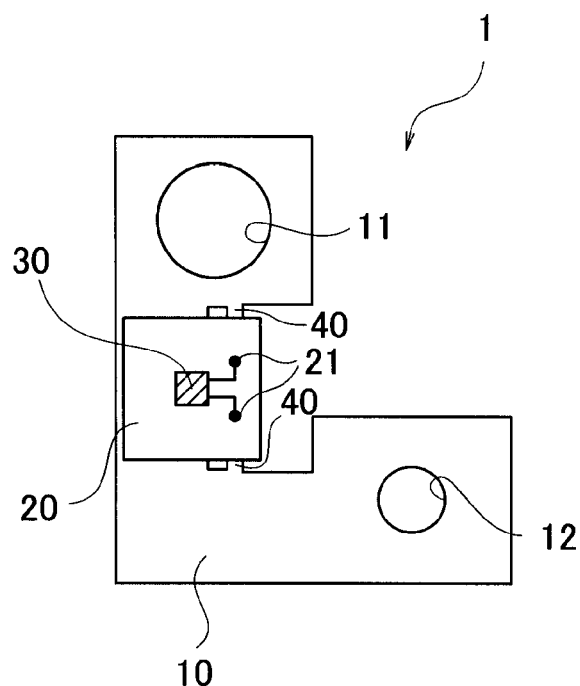
FIG. 1 is a top view diagrammatically showing a shunt resistor based current sensor of a first embodiment.
Figure 2:
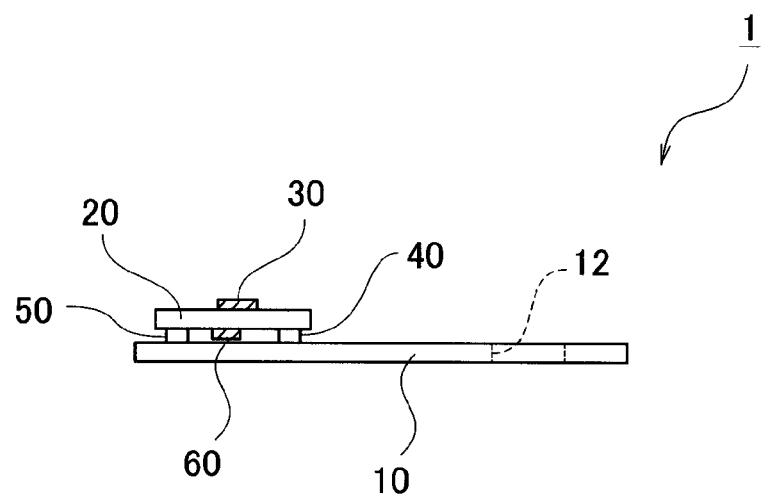
FIG. 2 is a side view diagrammatically showing the shunt resistor based current sensor shown in FIG. 1.

FIG. 1 is a top view diagrammatically showing a shunt resistor based current sensor 1 of a first embodiment, and FIG. 2 is a side view diagrammatically showing the shunt resistor based current sensor 1 shown in FIG. 1. The shunt resistor based current sensor 1 of the embodiment is used as a battery terminal, and includes a busbar 10, a circuit board 20, and a voltage detection IC 30.

Figure 3:
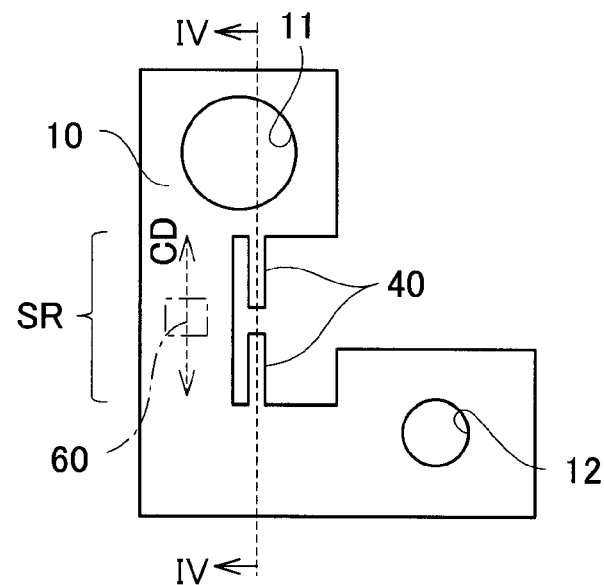
FIG. 3 is a top view diagrammatically showing a busbar of the shunt resistor based current sensor.

FIG. 3 is a top view diagrammatically showing the busbar 10 of the shunt resistor based current sensor 1. The busbar 10 is configured by an electrically conductive member having a substantially planar plate shape, such as a copper manganese alloy or a copper nickel alloy. The busbar 10 is configured by including a shunt resistor portion SR in a part thereof, so that a current to be measured can be flown therethrough.

The busbar 10 is formed from planar steel stock into a desired shape by press molding. For example, the busbar 10 is formed into a substantially L-like shape, and through holes 11, 12 are formed in respective tip end portions. The one through hole 11 functions as a hole for a battery post, and the other through hole 12 functions as a hole for a screw for fixing a wire harness.

Figure 4:
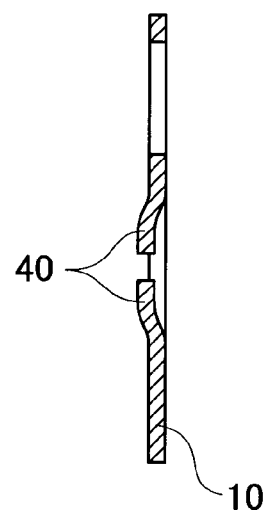
FIG. 4 is a sectional view of the busbar shown in FIG. 3, taken along line IV-IV.

FIG. 4 is a sectional view of the busbar 10 shown in FIG. 3, taken along line IV-IV. The shunt resistor based current sensor 1 includes a pair of connection terminal portions 40. The connection terminal portions 40 are disposed corresponding to both end portions of the shunt resistor portion SR, respectively. Each of the connection terminal portions 40 is formed by the same material as the busbar 10, and while being elongated from the busbar 10. For example, the busbar 10 and the connection terminal portions 40 are simultaneously formed from planar steel stock by press molding.

Each of the connection terminal portions 40 is formed so as to be directed to the inner side of the mounted place of the circuit board 20 in the busbar 10, and opposed to the other connection terminal portion 40, and into a cantilever-like shape in which the portions are raised from a planar portion of the busbar 10. In each of the connection terminal portions 40, the free end side is electrically connected to the circuit board 20 by soldering. In each of the connection terminal portions 40, moreover, the size in the width direction is smaller than that in the length direction.

The circuit board 20 is placed on the busbar 10, and electrically connected to the busbar 10. A circuit pattern 21 is formed on the circuit board 20. End portions of the circuit pattern 21 are connected to the free end sides of the above-described connection terminal portions 40.

A spacer 50 is a member which is interposed between the busbar 10 and the circuit board 20. Since the connection terminal portions 40 are configured into a cantilever-like shape and located at a position which is higher than the planar portion of the busbar 10, also the circuit board 20 is placed at a position which is higher than the planar portion of the busbar 10. Therefore, the circuit board 20 is supported by, in the place where the circuit board 20 is mounted, interposing the spacer 50 in the region opposite to the connection terminal portions 40.

The voltage detection IC 30 is mounted on the circuit pattern 21 formed on the circuit board 20. In order to detect the magnitude of the current to be measured flowing through the busbar 10, the voltage detection IC 30 detects the value of a voltage that is applied to the circuit board 20 (the voltage detection IC 30 corresponds to the voltage detecting unit). Namely, the voltage detection IC 30 detects a voltage drop produced in the shunt resistor portion SR of the busbar 10, and detects the magnitude of the current to be measured flowing through the busbar 10, from the voltage drop.

Moreover, the voltage detection IC 30 performs correction in accordance with the result of detection by a temperature sensor 60 which will be described later. Namely, the voltage detection IC 30 corrects the resistance of the shunt resistor portion SR in accordance with the result of the temperature so as not to be affected by a resistance change due to a temperature change and detect an erroneous current value.

As shown in FIG. 2, the shunt resistor based current sensor 1 further includes the temperature sensor 60. The temperature sensor 60 is disposed on a face of the circuit board 20 that is opposite to a face on which the voltage detection IC 30 is mounted, and placed so as to be close to the busbar 10. Therefore, the temperature sensor 60 detects the temperature of the vicinity of the busbar 10 (the temperature sensor 60 corresponds to the temperature detecting unit).

One of the features of the embodiment is that the temperature sensor 60 is placed positionally corresponding to a central portion of the shunt resistor portion SR in the busbar 10, specifically, a portion that is a central of the shunt resistor portion SR with respect to the direction CD along which the current flows.

Figure 5:
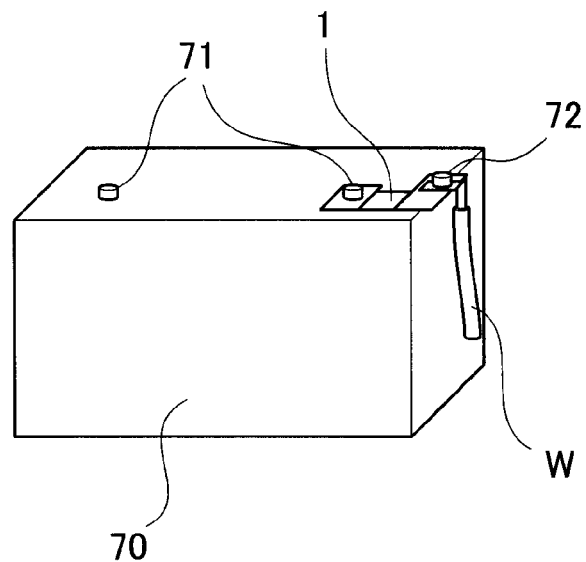
FIG. 5 is a view diagrammatically showing a use state of the shunt resistor based current sensor.

FIG. 5 is a view diagrammatically showing a use state of the shunt resistor based current sensor 1 of the embodiment. The busbar 10 of the shunt resistor based current sensor 1 of the embodiment is used as a battery terminal. For example, the through hole 11 of the busbar 10 is connected to a negative battery post 71 of a battery 70, and the other through hole 12 is connected to a wire harness W through a wire harness fixing screw 72.

Next, the function of the shunt resistor based current sensor 1 of the embodiment will be described. As shown in the use state of the shunt resistor based current sensor 1, the busbar 10 of the shunt resistor based current sensor 1 is connected to the battery post 71 and the wire harness W. In this case, depending on the travel status of a vehicle, a temperature difference is produced between a portion of the busbar 10 which is on the side of the battery post 71, and that which is on the side of the wire harness W. In the case where the temperature sensor 60 is placed while being shifted toward one of the battery post 71 and the wire harness W, therefore, a temperature biased in the temperature distribution of the busbar 10 is detected. In this case, a difference easily occurs between the detection value and the temperature of the shunt resistor portion SR which is the base of the resistance value.

Even in a situation where such a temperature difference occurs, when the temperature sensor 60 is placed positionally corresponding to a central portion of the shunt resistor portion SR, it is possible to detect an approximately average temperature of the shunt resistor portion SR while avoiding a temperature biased in the temperature distribution. As a result, the temperature of the shunt resistor portion which is the base of the resistance value is reliably detected to enable the accuracy of current detection to be improved.

In the case where the temperature sensor 60 is positionally corresponded to the central portion of the shunt resistor portion SR, coincidence which is in a strict sense is not required, and it is only necessary that the sensor is approximately positionally corresponded to the central portion in a range where an approximately average temperature of the shunt resistor portion SR can be detected.

Second Embodiment

Figure 6:
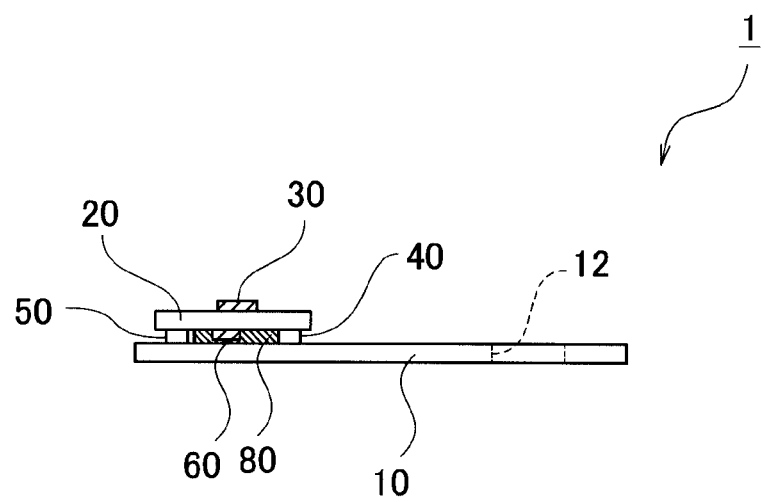
FIG. 6 is a side view diagrammatically showing a shunt resistor based current sensor of a second embodiment.

FIG. 6 is a side view diagrammatically showing a shunt resistor based current sensor 1 of a second embodiment. The shunt resistor based current sensor 1 of the embodiment is different from that of the first embodiment in that the accuracy of temperature detection in the shunt resistor portion SR is improved. Description of the points which are duplicated with the first embodiment will be omitted. Hereinafter, description will be made with placing emphasis on the different points.

As shown in FIG. 6, similarly with the first embodiment, the temperature sensor 60 is disposed on the surface of the circuit board 20 that is opposite to that on which the voltage detection IC 30 is mounted. That is, the temperature sensor 60 and the busbar 10 (shunt resistor portion SR) are placed with being opposed to each other. In the configuration, the shunt resistor based current sensor 1 has a heat conduction member 80 which is interposed between the busbar 10 and the circuit board 20, and which thermally connects the busbar 10 and the circuit board 20 to each other.

As the heat conduction member 80, any one of various members may be selected as far as more excellent heat conduction is obtained in the case where the heat conduction member 80 is interposed between the busbar 10 and the circuit board 20, as compared to that where it is not interposed. Namely, it is preferable that a member which is higher in thermal conductivity than air is used as the heat conduction member 80. For example, a resin may be used as the heat conduction member 80, and the heat conduction member 80 may be formed by filling the gap between the circuit board 20 and the busbar 10 with the resin.

As described above, the embodiment includes the heat conduction member 80, and therefore the thermal connection between the circuit board 20 (temperature sensor 60) and the busbar 10 can be efficiently attained, so that the accuracy of temperature detection can be improved. As a result, the temperature of the shunt resistor portion which is the base of the resistance is reliably detected to enable the accuracy of current detection to be improved.

Third Embodiment

Figure 7:
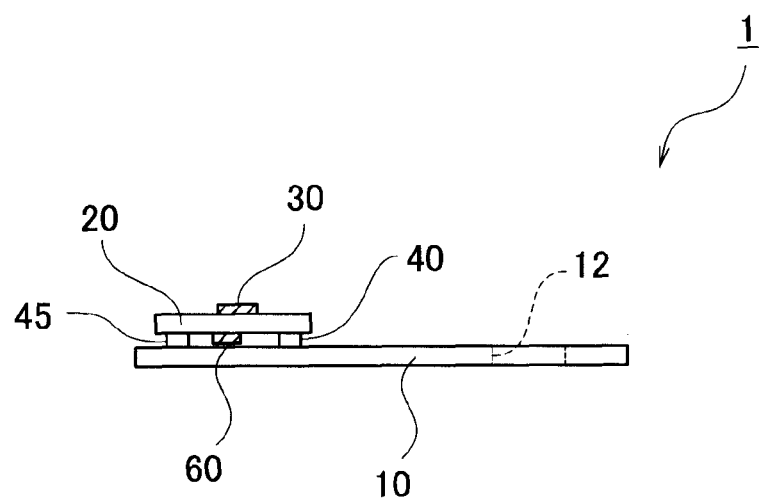
FIG. 7 is a side view diagrammatically showing a shunt resistor based current sensor of a third embodiment.

FIG. 7 is a side view diagrammatically showing a shunt resistor based current sensor 1 of a third embodiment. The shunt resistor based current sensor 1 of the embodiment is different from that of the first embodiment in that the accuracy of temperature detection in the shunt resistor portion SR is improved. Description of the points which are duplicated with the first embodiment will be omitted. Hereinafter, description will be made with placing emphasis on the different points.

Figure 8:
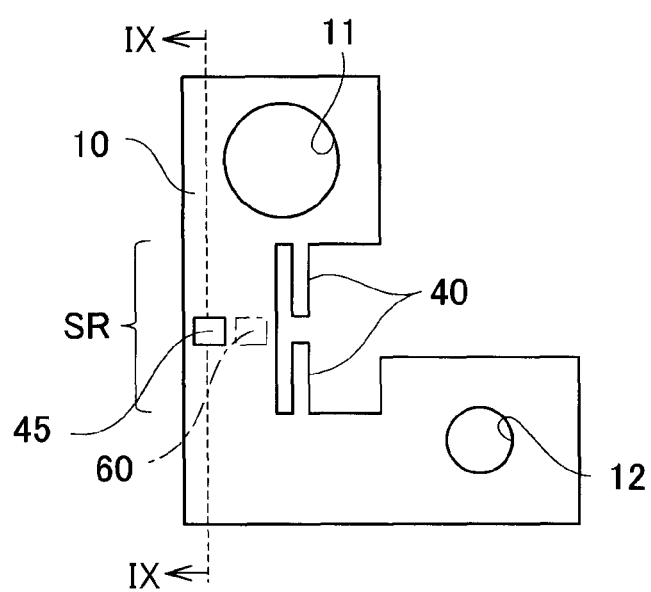
FIG. 8 is a top view diagrammatically showing a busbar of the shunt resistor based current sensor.
Figure 9:
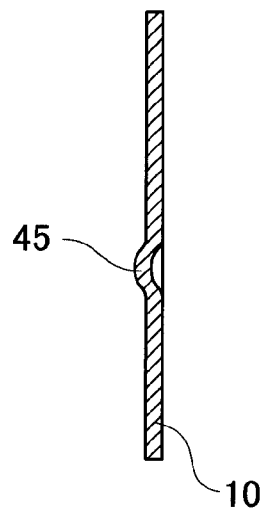
FIG. 9 is a sectional view of the busbar shown in FIG. 8, taken along line IX-IX.

FIG. 8 is a top view diagrammatically showing a busbar 10 of the shunt resistor based current sensor 1, and FIG. 9 is a sectional view of the busbar 10 shown in FIG. 8, taken along line IX-IX. As shown in FIGS. 8 and 9, the busbar 10 includes a connecting portion 45 which is connected to the circuit board 20, in order to thermally couple the busbar 10 and the temperature sensor 60 together. Similarly with the temperature sensor 60, the connecting portion 45 is placed positionally corresponding to a central portion of the shunt resistor portion SR in the busbar 10. The connecting portion 45 is formed by deforming a part of the busbar 10 toward the circuit board 20, and has a convex shape in which the apex joins the surface of the circuit board 20 that is opposite to that on which the voltage detection IC 30 is mounted. The connecting portion 45 can be formed by, for example, press molding in production of the busbar 10.

According to the embodiment, as described above, the busbar 10 includes the connecting portion 45, and therefore the thermal connection between the circuit board 20 (temperature sensor 60) and the busbar 10 can be efficiently attained, so that the accuracy of temperature detection can be improved. Therefore, the temperature of the shunt resistor portion which is the base of the resistance can be reliably detected, and the accuracy of current detection can be improved.

In order to thermally couple the busbar 10 and the temperature sensor 60 together, alternatively, a pattern (not shown) may be disposed on the circuit board 20 so as to be located between the connecting portion 45 and the temperature sensor 60, and the connecting portion 45 and the temperature sensor 60 may be thermally connected to each other. Therefore, thermal coupling between the busbar 10 and the temperature sensor 60 can be improved. According to the configuration, the temperature of the shunt resistor portion which is the base of the resistance value is reliably detected, and the accuracy of current detection can be improved.

Although the shunt resistor based current sensors of the embodiments have been described, the invention is not limited to the embodiments, and various changes can be made within the scope of the invention. For example, the busbar is not limited to the mode in which it includes the shunt resistor portion in a part of it, but also configured so that all of it is caused to function as the shunt resistor portion.

The features of the embodiments of the shunt resistor based current sensor of the above-described invention are briefly summarized and listed in following [1] to [4].

[1] A shunt resistor based current sensor comprising:
a busbar (10) that includes a shunt resistor portion (SR), and that has a substantially planar plate shape;
a circuit board (20) that is disposed on the busbar (10);
a pair of connection terminal portions (40) that are disposed corresponding to both end portions of the shunt resistor portion (SR), and that are electrically connected to the circuit board (20);
a voltage detecting unit (30) that is disposed on the circuit board (20), and that detects a value of a voltage that is applied to the circuit board (20) through the pair of connection terminal portions (40), in order to detect a magnitude of a current to be measured flowing through the busbar (10); and
a temperature detecting unit (60) that is disposed on the circuit board (20), and that detects a temperature of a vicinity of the busbar (10) in order to allow the voltage detecting unit (30) to perform section,
wherein the temperature detecting unit (60) is placed positionally corresponding to a central portion of the shunt resistor portion (SR) in the busbar (10).

[2] The shunt resistor based current sensor described in [1] above further comprising:
a heat conduction member (80) that is interposed between the busbar (10) and the circuit board (20).

[3] The shunt resistor based current sensor described in [1] above, wherein the busbar (10) further has a connecting portion (45) which is connected to the circuit board (20) by deforming a part of the busbar (10) toward the circuit board (20).

[4] The shunt resistor based current sensor described in [3] above, wherein the circuit board (20) includes a pattern which is located between the connecting portion (45) and the temperature detecting unit (60).

Although the invention has been described in detail and with reference to the specific embodiments, it is obvious to a person skilled in the art that various changes and modifications can be made without departing from the spirit and scope of the invention.

The application is based on Japanese Patent Application (No. 2011-271821) filed on Dec. 13, 2011, and the contents of which are incorporated herein by reference.

INDUSTRIAL APPLICABILITY

The invention achieves an effect that the temperature of the shunt resistor portion (SR) which is the base of the resistance reliably detected, whereby the accuracy of current detection can be improved, and is useful in the field of a shunt resistor based current sensor.

REFERENCE SIGNS LIST 1 shunt resistor based current sensor
10 busbar
11 through hole
12 through hole
20 circuit board
21 circuit pattern
30 voltage detection IC
40 connection terminal portion
45 connecting portion
50 spacer
60 temperature sensor
70 battery
71 battery post
72 fixing screw
80 heat conduction member
SR shunt resistor portion
W wire harness

The invention claimed is:

1. A shunt resistor based current sensor comprising:
a busbar that includes a shunt resistor portion, and that has a substantially planar plate shape;
a circuit board that is disposed on the busbar;
a pair of connection terminal portions that are disposed corresponding to both end portions of the shunt resistor portion, and that are electrically connected to the circuit board;
a voltage detecting unit that is disposed on the circuit board, and that detects a value of a voltage which is applied to the circuit board through the pair of connection terminal portions, in order to detect a magnitude of a current to be measured flowing through the busbar; and
a temperature detecting unit that is disposed on the circuit board, and that detects a temperature of a vicinity of the busbar in order to allow the voltage detecting unit to perform correction,
wherein the temperature detecting unit is placed positionally corresponding to a central portion of the shunt resistor portion in the busbar; and
wherein, interposed between the busbar and the circuit board is a connecting portion that thermally couples the busbar to the temperature detecting unit.

2. The shunt resistor based current sensor according to claim 1, further comprising:
a heat conduction member that is interposed between the busbar and the circuit board.

3. The shunt resistor based current sensor according to claim 1, wherein the circuit board includes a pattern which is located between the connecting portion and the temperature detecting unit.

4. The shunt resistor based current sensor according to claim 1, wherein the busbar is formed into a substantially L-like shape with a through hole being formed in at least one of end portions of the busbar.

5. The shunt resistor based current sensor according to claim 1, wherein the pair of connection terminal portions are configured into a cantilever-like shape.

6. The shunt resistor based current sensor according to claim 1, wherein the pair of connection terminal portions are formed by a same material of the busbar and are elongated from the busbar.

7. The shunt resistor based current sensor according to claim 1, wherein the temperature detecting unit is disposed on a surface that is opposite to a surface on which the voltage detecting unit is mounted.

8. The shunt resistor based current sensor according to claim 1, wherein the circuit board is supported by interposing the connecting portion in a region opposite to the connection terminal portions.

9. The shunt resistor based current sensor according to claim 1, wherein the connecting portion is part of the busbar deformed toward the circuit board.

10. The shunt resistor based current sensor according to claim 1, wherein the connecting portion is connected to the circuit board.

11. The shunt resistor based current sensor according to claim 1, wherein the connecting portion is placed in a position corresponding to the central portion of the shunt resistor portion in the busbar.

* * * * *